United States Patent
Crook et al.

(10) Patent No.: US 9,673,252 B1
(45) Date of Patent: Jun. 6, 2017

(54) FIELD-ASSISTED INFRARED DETECTOR WITH UNIPOLAR BARRIER

(71) Applicant: LOCKHEED MARTIN CORPORATION, Bethesda, MD (US)

(72) Inventors: Adam M. Crook, Goleta, CA (US); Matthew J. Reason, Goleta, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 14/825,501

(22) Filed: Aug. 13, 2015

Related U.S. Application Data

(60) Provisional application No. 62/036,759, filed on Aug. 13, 2014.

(51) Int. Cl.
| | |
|---|---|
| *H01L 31/0304* | (2006.01) |
| *H01L 27/146* | (2006.01) |
| *H01L 31/18* | (2006.01) |
| *H01L 31/0352* | (2006.01) |
| *H01L 31/109* | (2006.01) |

(52) U.S. Cl.
CPC .. *H01L 27/14649* (2013.01); *H01L 27/14683* (2013.01); *H01L 31/0304* (2013.01); *H01L 31/035272* (2013.01); *H01L 31/109* (2013.01); *H01L 31/184* (2013.01)

(58) Field of Classification Search
CPC ......... H01L 27/14649; H01L 27/14683; H01L 31/109; H01L 31/0304; H01L 31/035272; H01L 31/184
See application file for complete search history.

(56) References Cited

U.S. PATENT DOCUMENTS

| | | |
|---|---|---|
| 6,580,089 B2 | 6/2003 | Bandara et al. |
| 7,737,411 B2 | 6/2010 | Gunapala et al. |
| 8,217,480 B2 | 7/2012 | Ting et al. |
| 8,399,910 B2 | 3/2013 | Scott et al. |
| 2002/0125472 A1 | 9/2002 | Johnson et al. |
| 2010/0072514 A1 | 3/2010 | Ting et al. |
| 2010/0155777 A1 | 6/2010 | Hill et al. |
| 2011/0031401 A1* | 2/2011 | Mitra ................ H01L 31/02966 250/338.4 |
| 2011/0233709 A1 | 9/2011 | Scott et al. |
| 2012/0074462 A1 | 3/2012 | Freundlich et al. |

(Continued)

OTHER PUBLICATIONS

Shtrichman et al., "High Operating Temperature epi-InSb and XBn-InAsSb Photodetectors," Semiconductor Devices, May 2012, Israel.

(Continued)

*Primary Examiner* — Selim Ahmed
(74) *Attorney, Agent, or Firm* — Terry M. Sanks, Esq.; Beusse Wolter Sanks & Maire, PLLC

(57) ABSTRACT

Embodiments relate to photodetectors comprising: a substrate and a bulk-alloy infrared (IR) photo absorption layer disposed on the substrate to absorb photons in an infrared wavelength and having a graded section and an ungraded section. The photodetector comprises a unipolar barrier layer disposed on the bulk-alloy photo absorption layer. The graded section includes a graded alloy composition such that its energy bandgap is largest near the substrate and smallest near the unipolar barrier layer. The embodiments also relate to methods fabricating the photodetectors.

20 Claims, 7 Drawing Sheets

(56) References Cited

U.S. PATENT DOCUMENTS

2013/0146998 A1* 6/2013 Ting ................ H01L 31/02016
257/431
2013/0214373 A9 8/2013 Scott et al.

OTHER PUBLICATIONS

Maimon et al., "nBn Detector, an Infrared Detector with Reduced Dark Current and Higher Operating Temperature," Applied Physics Letters 89, 151109, 2006.
Broderick et al., "Band Engineering in Dilute Nitride and Bismide Semiconductor Lasers," Semicond. Sci. Technol., 27, 094011, 2012.
Klem et al., Comparison of nBn and nBp Mid-Wave Barrier Infrared Photodetectors, Proc. of SPIE, vol. 7608, 2010.

* cited by examiner

FIELD-ASSISTED INFRARED DETECTOR WITH UNIPOLAR BARRIER

CROSS-REFERENCE TO RELATED APPLICATION

This application claims the benefit of U.S. Provisional Application No. 62/036,759 filed Aug. 13, 2014, incorporated herein by reference in its entirety.

BACKGROUND

This disclosure generally relates to infrared detectors, and particularly relates to field-assisted infrared detectors with unipolar barriers.

Photodetectors are electro-optical devices that respond to incident electromagnetic radiation. A photodetector sensitive to infrared wavelengths of light is also known as an infrared (IR) detector. IR detectors are used in a wide variety of applications including thermal detection for surveillance, tracking, night vision, search and rescue, non-destructive testing and gas analysis. Typically, an IR detector is formed as a device consisting of an array, usually rectangular, of IR-sensing photodetectors disposed at the focal plane of an imaging lens. Such a detector is commonly referred to as a focal plane array (FPA).

Modern IR photodetectors are often produced using InSb and HgCdTe (mercury, cadmium, telluride (MCT)) materials fabricated as p-n junction diodes. However, InSb photodetectors based on p-n junctions require low operating temperatures due to generation-recombination (G-R) current from the p-n junction and surface generation current from passivation, and MCT photodetectors suffer from poor uniformity and correctability resulting in a distribution "tail" of lower performing pixels. MCTs are also limited due to the lack of commercially available, large format substrates. Although the use of cryogenic temperatures can reduce the dark current generated in, for example, the p-n junctions of the bulk materials and at the surface of the material by Shockley Reed Hall (SRH) generation, this approach is complex, expensive, and imposes serious size and energy limitations on the resulting devices.

Dark current affects many photosensitive devices and is characterized by a relatively small electric current that flows through the device even when no photons are entering the device. Dark current is one of the main sources of noise in imaging detectors such as IR detectors, and has traditionally been mitigated by operating the detectors at temperatures significantly below ambient (room) temperature as described above. Dark current occurs due to the random generation of electrons and holes within the device. Photodetectors employing p-n junctions are especially prone to generation of dark current due to low activation energies in the depletion region of such detectors.

IR detectors based on III-V alloys are an attractive alternative to MCT-based photodetectors because of the large commercial III-V infrastructure and the availability of high quality, large format substrate materials. Barrier photodetectors comprising a photo-absorbing layer, a barrier layer, and a contact layer have been developed that can tolerate significantly higher operating temperatures. One example of a photodetector using the barrier structure above is referred to as an nBn detector.

An nBn photodetector containing a unipolar barrier layer can be engineered in various ways to absorb a target IR waveband. The term "unipolar" means that the barrier that can block one carrier type (electron or hole) while allowing relatively unimpeded flow of the other carrier type. For example, these detectors may use a barrier layer whose minority carrier band edge lines up with the absorber minority carrier band edge so that carrier can be collected. The majority carrier band edge of the barrier is well above the contact or absorber band edge such that majority carriers are blocked or filtered—thus producing a so-called "majority carrier filter." In this construction the thickness of the barrier layer is sufficient to prevent tunneling of majority carriers from the photo-absorbing layer to the contact layer, and a barrier in the majority carrier energy band is sufficiently thick to block the flow of thermalized majority carriers from the photo-absorbing layer to the contact layer. Importantly, the barrier layer is engineered not to significantly block minority carriers when an appropriate bias voltage is applied.

SUMMARY

A barrier detector architecture and materials production process was discovered enabling the fabrication of field-assisted IR barrier detectors which may be configured as focal plane arrays (FPAs) that should be capable of imaging in high operating temperature (HOT) environments with low levels of noise and diffusion cross talk.

Embodiments relate to photodetectors and methods of fabricating the photodetector with a graded absorption layer. One embodiment includes an infrared (IR) photodetector, comprising: a substrate and a bulk-alloy infrared (IR) photo absorption layer disposed on the substrate to absorb photons in an infrared wavelength and having a graded section and an ungraded section. The photodetector includes a unipolar barrier layer disposed on the bulk-alloy photo absorption layer. The graded section includes a graded alloy composition such that its energy bandgap is largest near the substrate and smallest near the unipolar barrier layer.

Another aspect of the embodiments include an infrared photodetector comprising: a plurality of detector pixels; a substrate; and bulk-alloy photo absorption layers configured to absorb photons in an infrared wavelength. The bulk-alloy photo absorption layers comprise a graded absorption layer having a first valence band portion and an ungraded absorption layer having a second valence band portion. The photodetector includes a unipolar barrier layer disposed on the ungraded absorption layer and having a third valence band portion. A composition of the graded absorption layer is graded such that the first valence band portion forms an energy bandgap which is largest nearest the substrate and smallest nearest the unipolar barrier layer and the second valence band portion and third valence band portions are aligned to same valence band energy level.

A further aspect of the embodiments include a method of forming an infrared photodetector, the method comprising: forming a substrate; forming a bulk-alloy graded photo absorption layer having a first valence band portion; forming a bulk-alloy ungraded photo absorption layer having a second valence band portion; and forming a unipolar barrier layer disposed on the ungraded absorption layer and having a third valence band portion. A composition of the graded photo absorption layer is graded such that the first valence band portion forms an energy bandgap which is largest nearest the substrate and smallest nearest the unipolar barrier layer and the second valence band portion and third valence band portions are aligned to same valence band energy level.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which.

DETAILED DESCRIPTION

Figure 1:
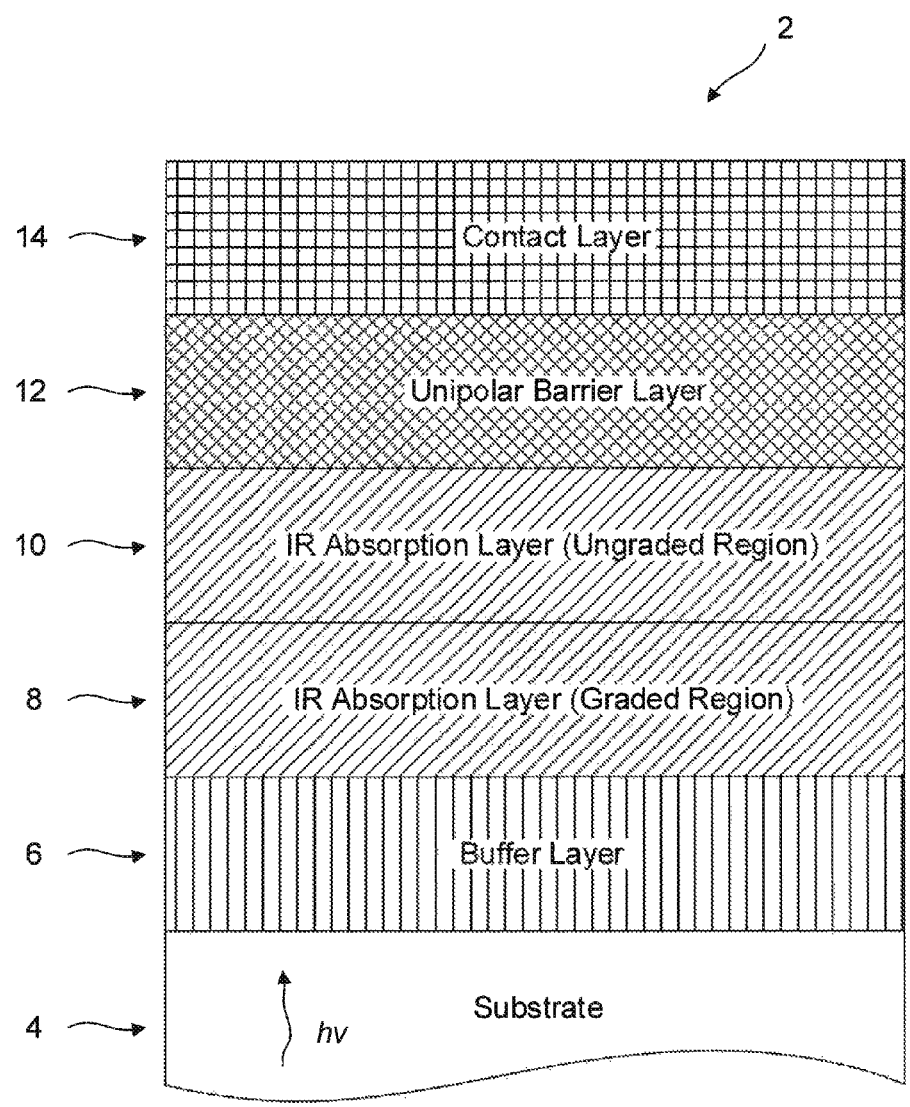
FIG. 1 is a cross-sectional illustration of a multi-layered barrier semiconductor structure containing a graded infrared absorption layer for a field-assisted barrier infrared detector.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting exemplary applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

The inventors discovered that an nBn detector allows the valence band alignment to be designed. In particular, for an n-doped photo-absorbing layer the heterojunction between the barrier layer and the absorbing layer is such that there is substantially zero valence band offset, i.e., the band gap difference appears almost exclusively in the conduction band offset. Alternatively, for a p-doped photo-absorbing layer the heterojunction between the barrier layer and the absorbing layer is such that there is substantially zero conduction band offset, i.e., the band gap difference appears almost exclusively in the valence band offset.

Use of barrier photodetectors, such as those that include an nBn structure, provides a number of advantages over other widely-employed structures (e.g., p-n junctions) for some embodiments. For example, these photodetectors can be operated with minimal to no depletion layer and, thus, the dark current is significantly reduced-allowing for high-operating temperature (HOT) operation for some embodiments. Furthermore, passivation is generally not strictly required in arrayed photodetector elements employing barrier detectors, because the barrier layer also functions to achieve passivation.

The inventors have discovered that the barrier detector architecture improves the operating temperature of infrared detectors by removing parasitic surface leakage and generation-recombination (G-R) contributions to dark current. The nBn detectors have the potential to achieve the manufacturability, operability, and correctability of InSb detectors, as well as the higher operating temperatures of MCT detectors. However, because only photo-generated carriers from the absorbing region that transport across the barrier are detected, the modulation transfer function (MTF) and radiation tolerance of barrier detectors depend on the nature of the transport from the absorbing region to the barrier region. MTF is the amplitude of a spatially periodic signal detected by the detector as a function of the signal's spatial frequency. The requirement for even smaller detector sizes (8 μm pixels or below) makes improving modulation transfer function (MTF) paramount. Also, displacement damage resulting from proton bombardment in orbit can reduce minority carrier lifetime in the active region of barrier photodetectors. This increases the dark current and decreases the diffusion length and collection efficiency of the detector. The resulting decrease in diffusion length causes a reduction of Quantum Efficiency (QE), which is the number of photoelectrons emitted from the photocathode divided by the number of incident photons, and is usually expressed as a percentage.

The embodiments may include a low-cost infrared detectors which are capable of operating under HOT conditions while simultaneously exhibiting improved MTF and radiation tolerance, and which can achieve high resolution (8 μm or below) in a small detector size.

Embodiments herein may enable the production of highly integrated Focal Plane Arrays (FPAs) that may be configured as field-assisted barrier IR detectors employing a detector structure capable of producing high Quantum Efficiency (QE), diffusion-limited detector performance in a small pixel by reducing or eliminating the perimeter and surface leakage currents. Field-assisted IR detectors described herein employ an nBn architecture in which an IR absorption layer contains a graded region in which the concentration of a dopant is varied resulting in a built-in electric field which enhances vertical transport of minority carriers in the structure.

The field-assisted transport definition is a carrier transport that is promoted in part, or in full, by a gradient in the electrostatic potential.

More specifically, the infrared detectors described herein may change the dominant conduction mechanism from diffusion, where the concentration gradient of minority carriers drives current, to drift, where electrostatic potential drives carrier collection.

In the barrier infrared detectors of one or more embodiments disclosed herein, a composition gradient is created in a photo absorption layer containing a bulk-alloy. This gradient may build or result in a vertical electric field which promotes minority carrier transport to the barrier for charge separation and current collection. For certain applications such as space technology, this composition gradient in the photo absorption layer allows for independent optimization of dark current and Quantum Efficiency (QE) radiation tolerance. The generated electric field promotes current collection where charge was generated, thus reducing crosstalk and improving MTF.

Embodiments of this disclosure are compatible with bulk-alloy photo absorption layers having higher absorption coefficients and hole mobilities than known superlattice alternatives.

Embodiments of this disclosure include semiconductor materials that can be used to fabricate a large variety of dual-band IR detectors. One embodiment is an nBn semiconductor material containing an IR absorption region including a graded region and an ungraded region. In this embodiment the barrier layer may be composed of a III-V semiconductor compound, and the graded IR absorption layer contains a III-V alloy in which the concentration of a Group III or Group V element is varied to alter the valence band leading to the generation of a vertical electric field. In such embodiments the barrier layer is lattice matched to the IR absorption layer.

In some embodiments the barrier layer prevents conduction of majority carriers (electrons) between absorbing and contact regions while allowing the transport of photo-generated minority carrier (holes) that can be converted into an output signal.

Figure 6:
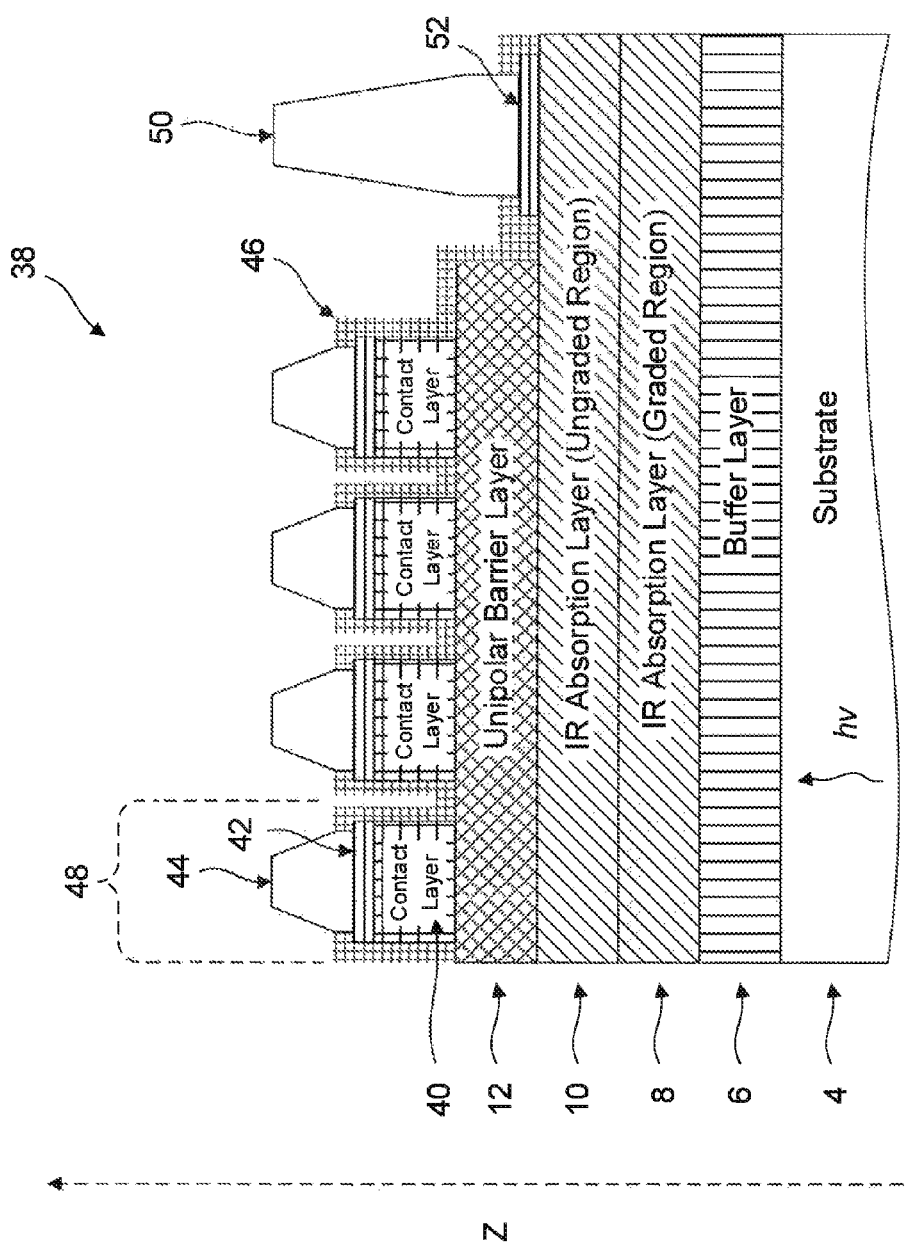
FIG. 6 is a cross-sectional diagram of a focal plane array field-assisted barrier infrared detector.

FIG. 1 is a cross-sectional illustration of a multi-layered barrier semiconductor structure 2 containing a graded infrared (IR) absorption layer 8 for a field-assisted barrier infrared detector 38 (as shown in FIG. 6). The structure 2 may be a graded nBn structure 2 comprises a substrate 4, a buffer layer 6, an IR absorption layer including a lower graded region 8 and an upper ungraded region 10, a barrier layer 12, and contact layer 14. The substrate 4 is provided as a base for deposition and optionally has deposited on one face the buffer layer 6 upon which the graded IR absorption layer 8 is deposited. The barrier layer 12 is sandwiched between the (lower) ungraded IR absorption layer 10 and the (upper) contact layer 14. As shown in FIG. 1, in operation of an exemplary detector based on the graded nBn structure 2, incoming photons may be directed through the transparent substrate and then absorbed within the absorption layers 8, 10. The term photo absorption layer and photo absorber layer may be used interchangeably herein. The barrier layer 12 may be a unipolar barrier layer 12.

Figure 2:
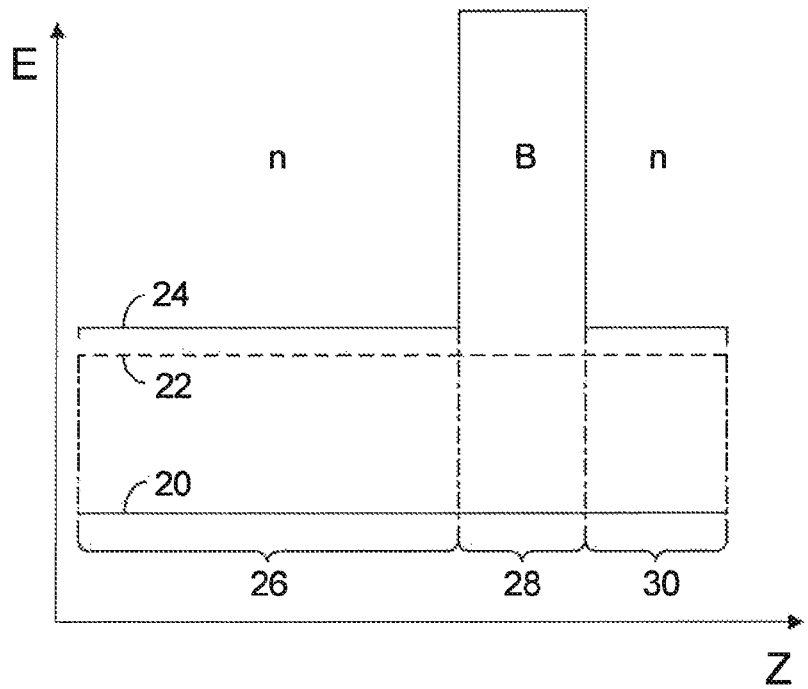
FIG. 2 illustrates an energy band diagram of a conventional (non-graded) barrier infrared detector.

FIG. 2 illustrates an energy band diagram for a conventional barrier infrared detector employing an ungraded photo absorber layer 26, a unipolar barrier layer 28, and a contact layer 30. In FIG. 2 the lower line corresponds to the valence band 20, the middle (dashed) line corresponds to the Fermi level 22, and the upper line corresponds to the conduction band 24. Because the absorption layer is ungraded, the valence band 20 line is flat (meaning the valence band level is essentially the same).

Figure 3:
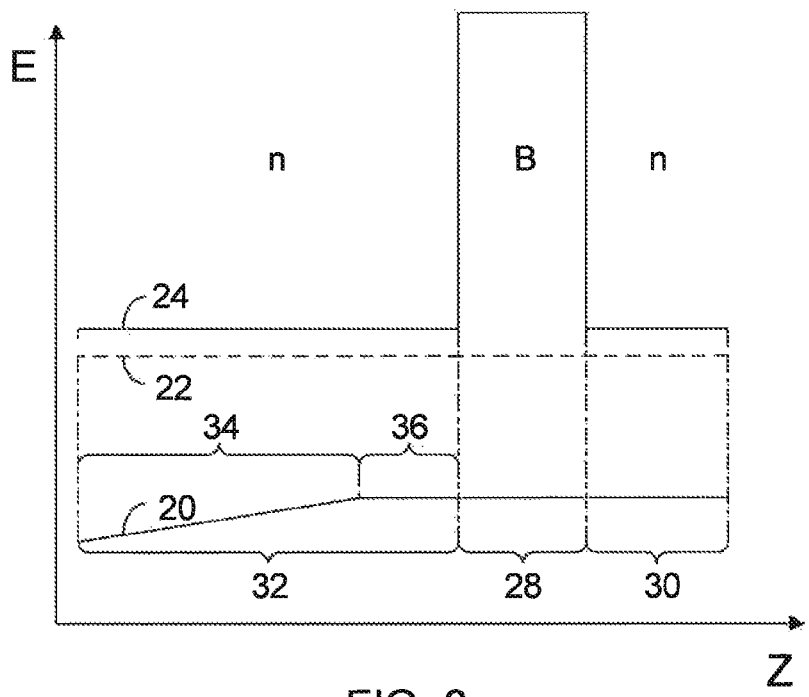
FIG. 3 is an energy band diagram of a field-assisted barrier infrared detector containing a continuously-graded absorption layer.

By contrast, FIG. 3 illustrates an energy band diagram of a field-assisted barrier infrared detector according to one or more embodiments. As shown in FIG. 3, the alloy composition in the absorption layer 32 is varied or graded in a first absorption section 34 and ungraded in a second absorption section 36. The first absorption section 34 having a first depth graded along the Z axis (depth from surface). In FIG. 3, the lower line corresponds to the valence band 20, the middle (dashed) line corresponds to the Fermi level 22, and the upper line corresponds to the conduction band 24. As with FIG. 2, that part of the energy band diagram associated with the barrier layer 28 in FIG. 3 is labeled with the letter "B," and those parts of the energy band diagram associated with the graded absorption layer 32 and the contact layer 30 are labeled with the letter "n". The effect of grading is evident in the graded section 34 in which the valence band 20 increases (from left to right in FIG. 3) as the content of the bulk-alloy contained in the absorption layer 32 is altered. The area of the valence band in the graded section 34 is a first valence band portion. Specifically, the valence band 20 within the graded section 34 increases because the composition of the bulk-alloy is altered causing the valence band 20 to increase (thereby decreasing the bandgap). The valence band 20 is represented by a line having a generally linear or smooth sloped profile for illustrative purposes. However, the variance in the valence band 20 may be less linear but may have a general trend upward to decrease the bandgap. In the ungraded absorption section 36 of the absorption layer 32, the valence band 20 is substantially aligned within valence bands of the barrier layer 28 and the contact layer 30—resulting in a flat line from the beginning of the ungraded absorption section 36 to and through the contact layer 30. The valence band 20 in the area of the ungraded absorption section 36 corresponds to a second valence band portion. The area of the valence band 20 corresponding to the barrier layer 28 is a third valence band portion. The area of the valence band 20 corresponding to the contact layer 30 corresponds to a fourth valence band portion. The second, third and fourth valence band portions are aligned to form a generally flat line representative of the band portions having the generally same valence band energy level.

The ungraded section 36 has a second depth along the Z axis and the energy level of the valence band 20 is essentially the same as the valence band of the barrier layer 28 and the valence band of the contact layer 30. By contrast, the conduction band 24 in the region of the barrier layer 28 is much higher relative to the regions of the absorption and contact layers 30, 32. The graded section 34 is independent from the ungraded section 36 in the absorption layer 32.

The depth of the absorption layer 32 includes the thickness of the graded section 34 and the thickness of the ungraded section 36. The thicknesses of one or more of the graded section 34 and the ungraded section 36 may be varied. For example, the depth of the ungraded section 36 may be varied (increased or decreased) for to optimize QE and/or dark current parameter. The depth of the graded section 34 may be varied to influence the rate of carrier flow to the barrier layer 28. As the thickness of the graded section 34 is shortened, the slope of the valence band, and the corresponding quasi-electric field promoting carrier drift, 20 may be varied. As the slope increases or becomes steeper, the rate of carrier flow to the barrier layer 28 is increased.

The graded section 34 essentially terminates at the beginning of the ungraded section 36. The ungraded section 36 essentially ends at the beginning of the barrier layer 28. The absorption layer may be engineered for 1) ratio of the rate of carrier flow in the vertical to lateral direction, influencing cross-talk or MTF, 2) Maintaining high QE in low-lifetime environment where diffusion length is reduce, and 3) dark current. The absorption layer is a graded n-doped semiconductor bulk-alloy. The carriers flow from left to right. The contact layer may be an n-doped semiconductor.

Figure 4:
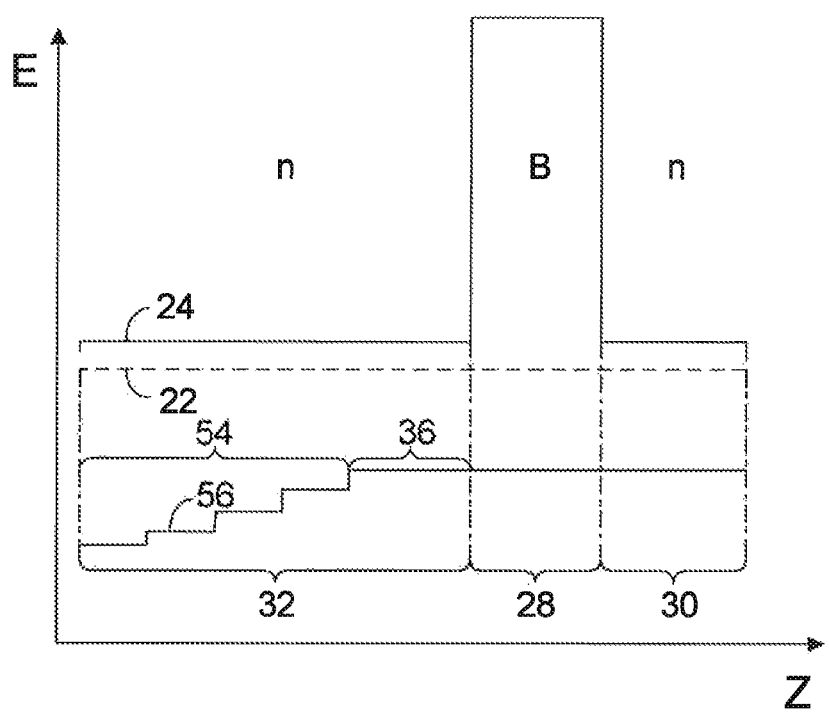
FIG. 4 is an energy band diagram of a field-assisted barrier infrared detector containing a discretely-graded absorption layer.

The non-limiting embodiment of FIG. 3 illustrates the use of a continuously graded absorption section 34. However, in other embodiments the graded section 34 may be graded in discrete steps as shown in FIG. 4. Unlike the continuously graded absorption section 34 of FIG. 3, the embodiment of FIG. 4 employs a graded section 54 containing a discretely (step-wise) graded absorption layer 56. Use of a discretely (step-wise) graded absorption layer can sometime be advantageous by simplifying calibration during growth of the detector structure. In the embodiment of FIG. 4, there are a plurality of steps in valence band energies corresponding to different alloy compositions of the individual layers. Each step has a flat or linear valence band energy for a step length corresponding to the length of the flat line representing the step. At each next step, the valence band energy is increased. In the embodiment of FIG. 4, the valence band of the ungraded section 36 is shown at a level higher than the last step of the graded absorption section 54. Hence, the ungraded section 36 has a composition which may be different from the graded absorption section 54.

In FIGS. 2-4, the energy band diagrams are shown as a function of energies (E) across the Z-axis (Z) which represents the growth direction of the detector structure 32.

Some embodiments (such as shown in FIG. 1) may include the buffer layer 6, but other embodiments exclude this layer such that the graded IR absorption layer 8 is directly applied to the substrate 4. In some instances both the substrate 4 and the buffer layer 6 can be omitted or removed in focal plane array processing of an infrared (IR) photodetector.

In nBn structures suitable for use in field-assisted IR photodetectors, the valence band of at least the barrier layer 12 is aligned to the valence band of the ungraded IR absorption layer 10. In other structures both the barrier layer 12 and the contact layer 14 are valence-band aligned to the valence band of the ungraded IR absorption layer 10.

In certain embodiments at least one of the IR absorption layers 8 and 10, the barrier layer 12, and the contact layer 14 is lattice matched to the substrate 4 or to the buffer layer 6. In other cases, at least two of these layers are lattice matched to the substrate 4 or to the buffer layer 6. In still other embodiments each of the IR absorption layers 8 and 10, the barrier layer 12, and the contact layer 14 may be lattice matched to a substrate 4 or to a buffer layer 6.

Suitable substrate materials may include, for example, InAs, InSb, InP, GaSb, GaAs, Si and Ge, but are not limited to these materials where Ga is gallium, In is indium, Sb is antimony, As arsenic, Si silicon, P is phosphorus, and Ge germanium.

In some embodiments the IR absorption layers 8 and 10, the barrier layer 12, and the contact layer 14 contain III-V semiconductor compounds. In some embodiments at least one of the IR absorption layers 8 and 10 and the contact layer 14 is optionally a dilute-nitride III-V alloy.

As used herein, the terms "III-V semiconductor," "III-V material," "III-V compound" and "III-V alloy" mean and include any semiconductor material that is at least predominantly comprised of one or more elements from group IIIA of the periodic table (boron (B), aluminum (Al), gallium (Ga), indium (In), and titanium (Ti) and one or more elements from group VA of the period table which include nitrogen (N), phosphorus (P), arsenic (As), antimony (Sb) and bismuth (Bi). For example, III-V materials may include, but are not limited to, GaN, GaAs, GaSb, InAs, AlAs, InGa, GaInAs, InAsSb, AlGa Sb, etc. III-V alloys as defined above also include nitride-containing III-V alloys (also referred to as "III-N-V alloys") and dilute-nitride-containing III-V alloys (also referred to as "dilute III-N-V alloys" or "III-N-V alloys") in which group V anions of conventional III-V alloys are substituted with small amounts of nitrogen. Dilute III-N-V alloys include, for example, InNAsSb, GaAsN, GaInAsN, GaSbN, GaInSbN, GaAsSbN, InAsN, InSbN, etc.

In one or more embodiments, the material of the barrier layer 12 may be selected such that the valence and conduction bands are configured to produce either a majority carrier filter or a minority carrier filter as appropriate for a particular application. The barrier layer 12 may contain any suitable material such as, for example, AlSb, AlAsSb, AlGaSb, AlGaAsSb, AlPSb, AlGaPSb and HgZnTe.

The IR absorption layers 8 and 10, the barrier layer 12, and the contact layer 14 may be fabricated as single layers, or may be fabricated as multi-layers. That is, one embodiment may include a multi-layered IR absorption layer 8 or 10 in a barrier structure in which the barrier layer 12 and the contact layer 14 are each single layers. In some cases more than one of the IR absorption layers 8 and 10, the barrier layer 12 and the contact layer 12 are themselves fabricated as multi-layers. In some embodiments the barrier layer 12 may be constructed of multi-layers such that the level of valence-band matching can be varied along a thickness of the barrier layer 12 to accommodate other (less valence-band-matched) functional layers having beneficial properties. Other functional layers may include, by illustration, oxidation resistant layers and etch-stop layers. The term "multi-layers" as used herein includes multiple layers of equivalent thickness or multiple layers of varying thickness and alloy compositions.

In one embodiment, the absorption layer 32 may include absorption layers 8 and 10 which may be composed of an aluminum-containing III-V alloy composition, which may for example be AlInGaAsSb. Within the graded absorption layer 8, the aluminum (Al) content of the aluminum alloy is graded so that its bandgap is largest near the substrate 4 and smallest near the barrier layer 12. In one embodiment the concentration of the Group-III element (such as aluminum) in the graded absorption layer 8 decreases from about 5% near the substrate 4 to about 0% near the ungraded absorption layer 10. To maintain lattice matching within the absorption layer 32, the concentration of antimony (Sb) would be correspondingly increased. This grading creates a built-in electric field promoting transport of minority carriers (holes) which improves collection efficiency of the detector. Suitable graded III-V alloys may vary elements other than aluminum (Al) and antimony (Sb). The above concentration variation is provided merely as an example and other grading concentrations are contemplated in one or more embodiments.

The composition gradient in the graded absorption layer 8 allows for independent optimization of dark current and Quantum Efficiency (QE) radiation tolerance, which can be useful in certain applications (e.g., space technologies). In addition, the generated electric field allows background doping in the absorption layer 32 to be increased providing increased resilience to displacement damage caused by radiation exposure. Such increased doping would normally not be permissible in known detectors because the diffusion length of the detector is reduced dramatically with the lower lifetime that results from higher doping. At some point, the increased doping would result in Auger limited lifetime causing parasitic dark current.

Embodiments are not limited to the barrier structure of FIG. 1, but also include barrier structures in which other functional layers may be disposed between the heterojunctions of FIG. 1. In one or more embodiments, the barrier structure may include a unipolar barrier layer.

The use of dilute-nitride-containing III-V alloys within the absorption and/or contact layers 8, 10 and 14 in some embodiments allow tuning of the respective layers allowing the fabrication of dual-band (two-color) IR detectors tuned to detect cut-off wavelengths in different IR absorption regions. The behavior of a semiconductor junction depends crucially on the alignment of the energy bands at the interface. This is true for nBn detectors in which ideally the heterojunction between the barrier layer and the absorption layer is engineered such that there is substantially zero valence band offset, i.e., the band gap difference appears almost exclusively in the conduction band offset (as shown in FIG. 3).

In some embodiments the band gap of the contact layer 14 may be precisely tuned while maintaining valence-band alignment with both the barrier layer 12 and the IR absorption layers 8 and 10 by, for example, modulating the content of nitrogen (N) contained in a III-N-V alloy contained in the contact layer 14. This ability to precisely tune the band gap of the contact layer 14 is due in part to the observation that when nitrogen is added to a III-V alloy the band gap of the resulting dilute III-N-V alloy is reduced, but the valence band remains unchanged. This effect originates from an anti-crossing interaction between extended conduction-band states and localized N states in III-N-V alloys. In such embodiments, the contact layer 14 may function as an IR absorption layer capable of detecting a different IR region (relative to the IR absorption region 8, 10) by operating the detector in reverse bias mode.

Figure 5:
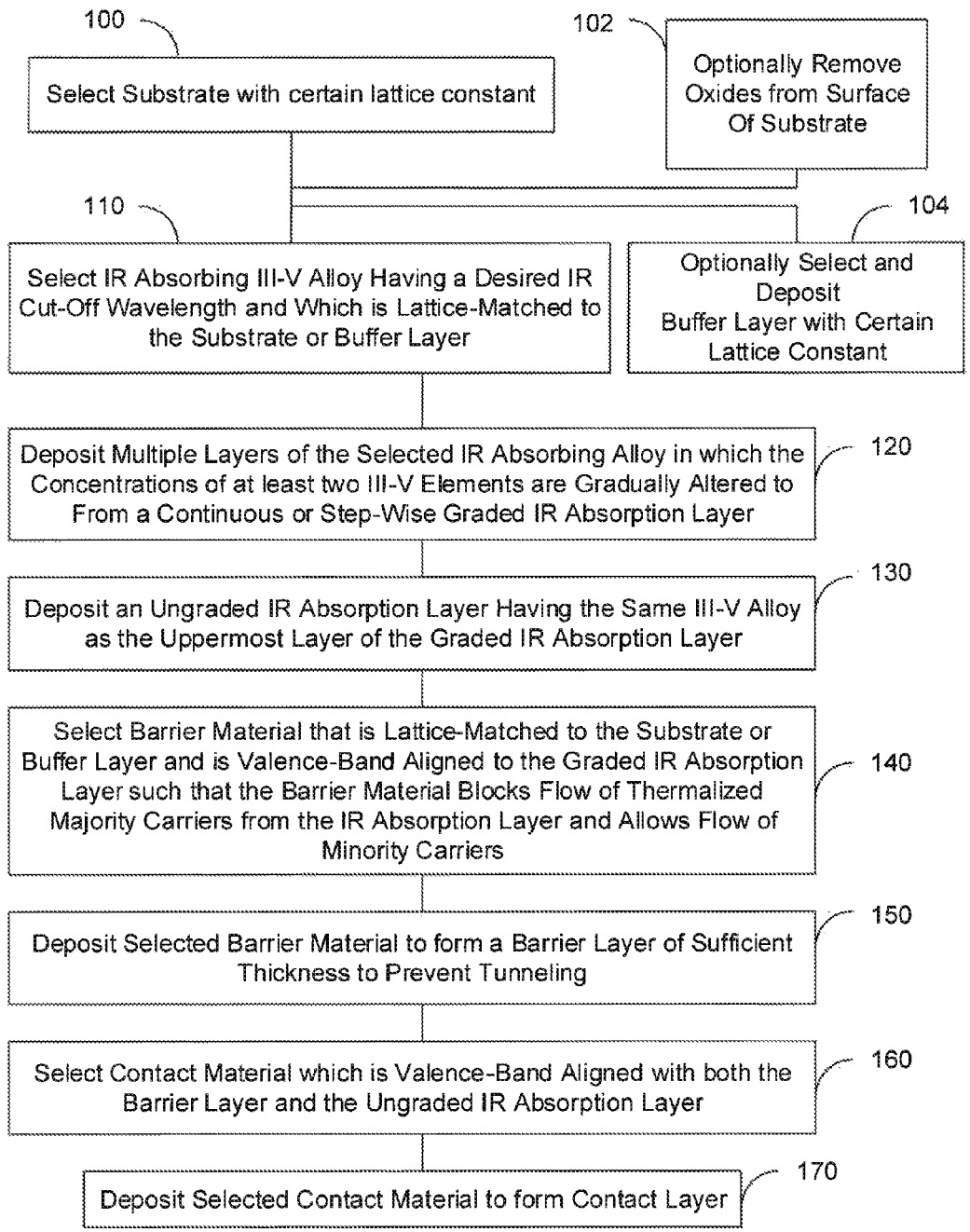
FIG. 5 is a flow chart of a process for manufacturing one embodiment of the multi-layered barrier semiconductor of FIG. 1.

FIG. 5 illustrates a flow chart of a process for manufacturing one embodiment of a field-assisted III-V barrier semiconductor material. The embodiment of FIG. 1, for example, can be produced using the process depicted in FIG. 5.

In this embodiment the process begins by selecting, in step 100, a substrate having a certain lattice constant. Oxides likely to be present on the surface of the substrate may optionally be removed, in step 102. In optional step 104, a buffer layer having a certain lattice constant may be selected and deposited onto the surface of the substrate. In step 110, an IR absorbing III-V alloy having a desired IR cut-off wavelength and which is lattice-matched to the substrate or buffer layer is selected. In step 120, multiple layers of the selected IR absorbing alloy are deposited such that the concentration of at least two III-V elements are gradually altered to form a continuous or step-wise graded IR absorption layer. In step 130, an ungraded IR absorption layer having the same III-V alloy composition as the uppermost layer of the graded IR absorption layer is deposited. In step 140, a barrier material that is lattice-matched to the substrate or buffer layer and is valence-band aligned to the graded IR absorption layer (such that the barrier material is capable of blocking the flow of thermalized majority carriers from the IR absorption layer and allows the flow of minority carriers) is selected. In step 150, the selected barrier material is deposited to form a barrier layer of sufficient thickness to prevent tunneling. In step 160, a contact material which is valence-band aligned with both the barrier layer and the ungraded IR absorption layer is selected. In step 170, the selected contact material is deposited onto the barrier layer to form a contact layer.

Photodetector materials produced by, for example, the process depicted in FIG. 5, may be physically grown using liquid phase epitaxy (LPE), molecular beam epitaxy (MBE), metal-organic chemical deposition (MOCVD), or by other methods known to those skilled in the art on substrate materials such as InSb, InAs, InP, GaSb, GaAs, etc.

One embodiment amenable to the production of field-assisted III-V barrier semiconductor materials employs an MBE growth process in which group III effusion cells are used to deposit Ga, In and Al, and valved crackers are used to deposit group V elements Sb and As. The temperature of the group-III effusion cell and/or the valve position of the group-V elements are ramped during the formation of the graded IR absorption layer 8. In order to achieve a linear composition change, an exponential temperature profile may be applied to the group-III effusion cells resulting in a linear decrease (or increase) in elemental flux. In some embodiments it may be advantageous to choose a discrete number of group-V valve positions and grade them digitally through the graded region of the absorber region. Other approaches to grading the layer composition include chirping the shutter period for digitally graded alloys in which the duty cycle is adjusted to control the relative alloy compositions. In some embodiments employing nitrogen a radio frequency (RF) inductively-coupled (IC) plasma is used to deposit elemental nitrogen. Deflection plates positioned external to the plasma cell may also be used to direct high energy ions away from the growing semiconductor.

A wide variety of field-assisted barrier IR photodetectors can be fabricated from barrier semiconductor materials described herein.

FIG. 6 is a cross-sectional illustration of a field-assisted IR barrier photodetector 38 which is capable of being manufactured using the process depicted in FIG. 5. In this embodiment a buffer layer 6 is sandwiched between a substrate 4 and a graded IR absorption layer 8, an ungraded IR absorption layer 10 is sandwiched between the graded IR absorption layer 8 and a barrier layer 22, and the barrier layer 22 is sandwiched between the ungraded IR absorption layer 10 and a plurality (array) of contact layers 40 which are divided into a plurality of contact regions (pixels) 48. Each contact region (pixel) 48 contains a metallic active layer 42 (attached to a corresponding contact layer 40) and a passivated area 46. Each contact region 48 includes a pixel bump 44, and a ground 50 is attached to the ungraded IR absorption layer 10 via a metallic active layer 52. Collectively, the graded IR absorption layer 8 and the ungraded IR absorption layer 10 form the absorption layer 32. Each layer 8 and 10 may also be multi-layered or the absorption layer 32 may be a single layer.

In operation of the photodetector 38 of FIG. 6, the barrier layer 12 presents a high barrier to carrier flow in the conduction band of the IR absorption layers 8, 10. This enables the photodetector 38 to sense IR photons absorbed by the IR absorption layers 8, 10 by placing a forward bias across the pixel bumps 44 and the ground 50. When applying a forward bias the barrier layer 12 presents a high barrier to carrier flow in the conduction band, but a negligible barrier to carrier flow in the valence band. This enables a bias to be placed across the device without majority carrier current flow, while allowing the collection of photo-generated minority carriers.

In this field-assisted infrared detector the absorption layer 8 is graded so that its bandgap is largest near the substrate and smallest near the barrier layer 12. The grading of the IR absorption layer 8 changes the dominant conduction mechanism from diffusion (where the concentration gradient of minority carrier drives current) to drift (where electrostatic potential drives carrier collection) because of a resulting built-in vertical electric field generated in the IR absorption layers 8,10.

Referring to FIG. 6, the photo absorption layers 8, 10 have a length, width (in-plane) and a height or depth along a Z-axis. The Z-axis corresponds to the growth direction. The absorption layer 8 is graded along the Z axis such that the composition of the bulk-alloy varies in the Z-axis which is growth direction but is constant along in the in-plane.

A photodetector, such as the field-assisted barrier IR photodetector of FIG. 6, may be fabricated from a barrier semiconductor structure using a variety of methods known in the art.

In one process a metallic contact layer (progenitor of the metallic active area 42 shown in FIG. 6) is deposited onto the contact layer 14 of a multi-layered barrier structure 2 such as the embodiment depicted in FIG. 1. The contact layer is pixel patterned with a pixel delineation mask and is etched to define contact regions 40 of an array of pixels 48. An exposed portion of the metallic contact layer is etched down to the barrier layer 12. Outside of the pixel region, the metallic contact layer is etched down to the ungraded IR absorption layer 10. A metallic contact layer 52 is deposited onto the exposed surface of the ungraded IR absorption layer 10. Contact bumps 44 are then deposited onto the metallic contact layers 42, 52 to form an array of detector pixels 48 attached to the barrier layer 12 and to form a ground 50 attached to the ungraded IR absorption layer 10. The resulting detector 38 may then be attached to an electronic support package (e.g., a readout integrated circuit (ROIC)) to produce a field-assisted barrier IR photodetector 38 capable of applying a bias to sense absorption at either the IR absorption layer 8, 10.

Figure 7:
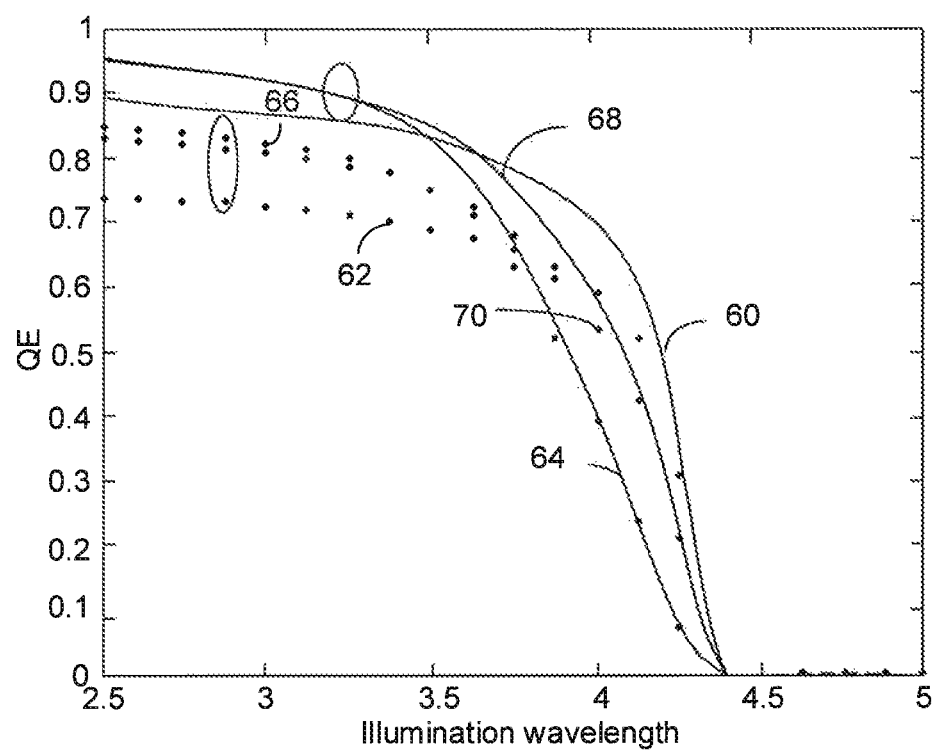
FIG. 7 is a diagram of simulated spectral Quantum Efficiency (QE) curves for conventional and field-assisted barrier infrared detectors as a function of proton irradiation dose.

FIG. 7 is a diagram of simulated spectral Quantum Efficiency (QE) curves for conventional and field-assisted barrier infrared detectors as a function of proton irradiation dose. The solid curve 60 plots QE versus illumination wavelength for a baseline 4.2 μm cut-off detector with 0 kRad of Si radiation exposure. The dashed curve 62 plots QE versus illumination wavelength for the baseline detector after 100 kRad of Si radiation exposure. The degradation of approximately 20% in QE is due to the reduction in the diffusion length in the absorption region of the baseline detector.

In FIG. 7 the solid curve 64 plots QE versus illumination wavelength in μm for a detector with a 3.7 μm graded region and a 0.3 μm ungraded region with 0 kRad of Si radiation, and the dashed curve 66 is for this detector after 100 kRad of Si radiation. The graded region may grade between 3.8 μm and 4.2 μm of bandgap material. Compared to the baseline detector, the graded detector has lower QE for wavelengths greater than 3.5 μm with 0 kRad of Si radiation dose. However, after a 100 kRad dose, the graded structure has degraded less than half as much as the baseline detector.

In FIG. 7 the solid curve 68 plots QE version illumination frequency for a detector with a 2 μm graded region and a 2 μm ungraded region with 0 kRad of Si radiation, and the dashed curve 70 is for this detector after 100 kRad of Si radiation. Similar to the thicker graded region described above, this field-assisted detector shows a tolerance to the reduced lifetime introduced with radiation exposure. The QE degradation is comparable between the two detectors but the penalty associated with the reduced absorption coefficient near the band edge of the ungraded region is reduced.

Figure 8:
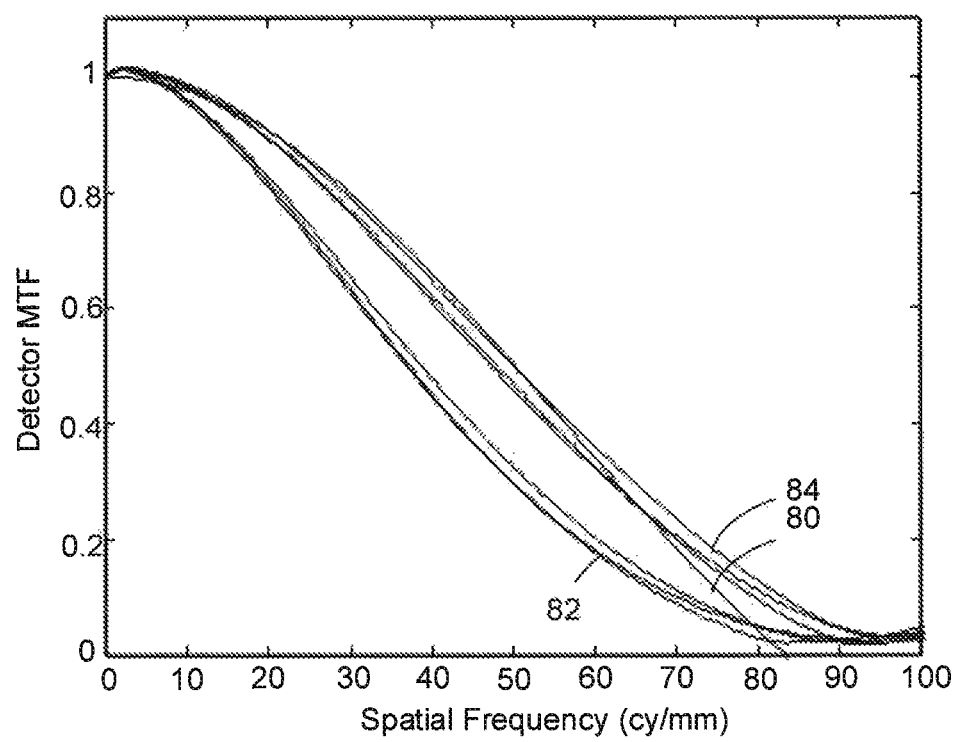
FIG. 8 is a diagram of a measured modulation transfer function for field-assisted and conventional barrier infrared detectors.

FIG. 8 is a diagram of a measured modulation transfer function (MTF) versus spatial frequency in cy/mm (cycles/millimeter) for field-assisted and conventional barrier infrared detectors. The measurements were taken on 1024×1280 12 μm pitch focal plane arrays with capacitance transimpedance amplifier unit cells with a slit scan measurement setup. The measurements have been corrected for slit motion and optics components to the line spread function. The curve 80 plots detector MTF versus spatial frequency for an ideal 12 μm detector. The curves 82 are baseline nBn detectors with 4 μm thick absorbers and no gradient. The curves 84 are graded detectors as shown in FIG. 6 with 2 μm graded regions and 2 μm ungraded regions and a grading from 3.7 μm to 4.1 μm. As shown the field-assisted detectors 84 demonstrate near-ideal MTF for 12 μm pitch.

The technology described herein is applicable to FPAs that combine a camera sensor engine-on-a-chip for SWIR, MWIR, and LWIR applications.

Figure 9:
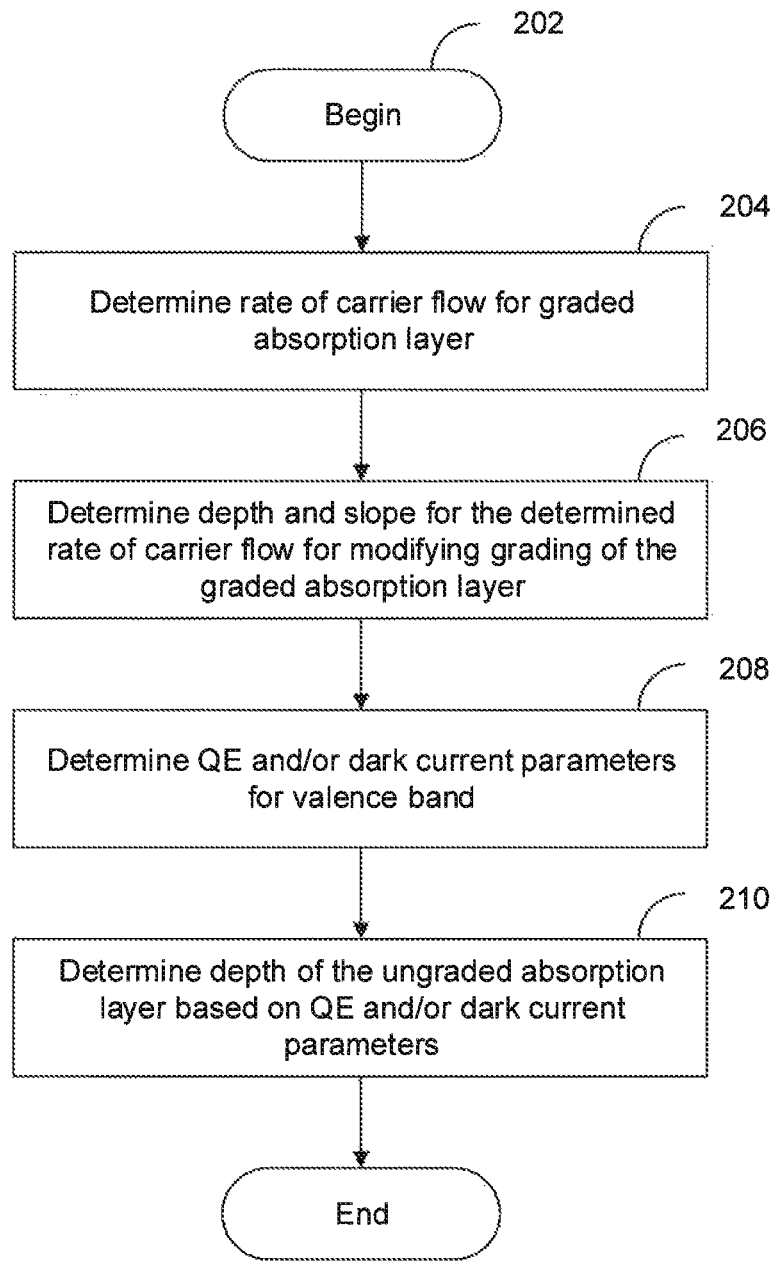
FIG. 9 is a flow chart of a process for designing the graded and ungraded sections of the absorption layer.

FIG. 9 is a flow chart of a process 200 for designing the graded section 34 and ungraded section 36 of the absorption layer 32. The process 200 begins at block 202. At block 204, the rate of carrier flow for the graded absorption section 34 (or graded absorption layer 8) is determined. At block 206, the depth and slope for the determined rate of carrier flow for modifying or establishing the grading of the graded absorption section 34 (or graded absorption layer 8) is determined. Grading may be determined for collection efficiency. At block 208, the QE and dark current radiation tolerance parameters for the valence band are determined. At block 210, the depth of the ungraded absorption section 36 is determined for the QE and dark current radiation tolerance parameters. The determined depth of the ungraded section 34 may reduce an absorption coefficient near the band edge of the ungraded section.

Both the graded absorption section 34 and the ungraded absorption section 36 may be further designed for lattice-matching depending on the semiconductor layering.

One or more of the blocks described herein may be performed in the order shown or a different order. Furthermore, one or more blocks may be omitted and others added. The some of the blocks may be performed contemporaneously.

The features of the embodiments which are believed to be novel are set forth below with particularity in the appended claims. However, modifications, variations, and changes to the embodiments described above will be apparent to those skilled in the art, and the field-assisted infrared detector described herein thus encompasses such modifications, variations, and changes and are not limited to the specific embodiments described herein.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Therefore, the breadth and scope of the subject matter provided herein should not be limited by any of the above explicitly described embodiments. Rather, the scope of the embodiments should be defined in accordance with the following claims and their equivalents.

We claim:

1. An infrared (IR) photodetector, comprising:
    a substrate;
    a bulk-alloy infrared (IR) photo absorption layer disposed on the substrate to absorb photons in an infrared wavelength and having a graded section and an ungraded section; and
    a unipolar barrier layer disposed on the bulk-alloy photo absorption layer,
    wherein the graded section includes a graded alloy composition such that its energy bandgap is largest near the substrate and smallest near the unipolar barrier layer.

2. The photodetector of claim 1, wherein the barrier layer includes a valence band, the graded section is near the substrate; and the ungraded section is nearest to the unipolar barrier layer and includes a valence band which is aligned with the valence band of the unipolar barrier.

3. The photodetector of claim 2, further comprising a contact layer comprising an n-type semiconductor and a valence band aligned with the valence band of the ungraded section and the unipolar barrier; and wherein the bulk-alloy photo absorption layer comprises an n-type semiconductor.

4. The photodetector of claim 1, wherein the bulk-alloy photo absorption layer comprises a III-V semiconductor in which a group-III atomic concentration is graded in the graded section.

5. The photodetector of claim 1, wherein the bulk-alloy photo absorption layer comprises a III-V semiconductor in which a group-III atomic concentration is graded in the graded section from about 5% to about 0%.

6. The photodetector of claim 1, wherein the bulk-alloy photo absorption layer comprises aluminum such that a concentration of the aluminum increases in the graded section from the substrate in a direction to the unipolar barrier layer.

7. The photodetector of claim 1, wherein the graded section comprises a III-V semiconductor in which a concentration of at least two III-V elements are gradually altered to form a continuous graded section.

8. An infrared photodetector comprising:
    a plurality of detector pixels;
    a substrate;
    bulk-alloy photo absorption layers configured to absorb photons in an infrared wavelength, the bulk-alloy photo absorption layers comprising a graded absorption layer having a first valence band portion and an ungraded absorption layer having a second valence band portion; and
    a unipolar barrier layer disposed on the ungraded absorption layer and having a third valence band portion,
    wherein a composition of the graded absorption layer is graded such that the first valence band portion forms an energy bandgap which is largest nearest the substrate and smallest nearest the unipolar barrier layer and the second valence band portion and third valence band portions are aligned to same valence band energy level.

9. The photodetector of claim 8, wherein the graded absorption layer comprises a III-V semiconductor in which a group-III atomic concentration is graded.

10. The photodetector of claim 9, further comprising a contact layer comprising an n-type semiconductor and a fourth valence band portion aligned with the second valence band portion and the third valence band portion; and wherein the bulk-alloy photo absorption layers comprises an n-type semiconductor.

11. The photodetector of claim 8, wherein the ungraded absorption layer is engineered for Quantum Efficiency and/or dark current radiation tolerance and the graded absorption layer is engineered for carrier transport and collection efficiency.

12. The photodetector of claim 8, wherein the graded absorption layer comprises aluminum such that a concentration of the aluminum increases from the substrate in a direction toward the unipolar barrier layer.

13. The photodetector of claim 8, wherein the graded absorption layer comprises a III-V semiconductor in which a concentration of at least two III-V elements are gradually altered to form a continuous graded absorption layer or a stepwise graded absorption layer.

14. The photodetector of claim 8, wherein the graded absorption layer is lattice matched to the substrate.

15. A method of forming an infrared photodetector, the method comprising:
    forming a substrate;
    forming a bulk-alloy graded photo absorption layer having a first valence band portion;
    forming a bulk-alloy ungraded photo absorption layer having a second valence band portion; and
    forming a unipolar barrier layer disposed on the ungraded absorption layer and having a third valence band portion,
    wherein a composition of the graded photo absorption layer is graded such that the first valence band portion forms an energy bandgap which is largest nearest the substrate and smallest nearest the unipolar barrier layer and the second valence band portion and third valence band portions are aligned to same valence band energy level.

16. The method of claim 15, wherein the forming of the graded photo absorption layer comprises forming a III-V semiconductor in which a group-III atomic concentration is graded.

17. The method of claim 16, further comprising:
forming a contact layer comprising an n-type semiconductor and a fourth valence band portion aligned with the second valence band portion and the third valence band portion; and wherein the bulk-alloy photo absorption graded and ungraded layers comprise an n-type semiconductor.

18. The method of claim 15, wherein the forming of the graded photo absorption layer comprises forming a III-V semiconductor in which a concentration of at least two III-V elements are gradually altered to form a continuous graded absorption layer or a stepwise graded absorption layer.

19. The method of claim 15, wherein the forming of the graded photo absorption layer comprises growing the graded photo absorption layer using molecular beam epitaxy and ramping a temperature of a group-III effusion cell.

20. The method of claim 15, wherein the forming of the graded photo absorption layer comprises growing the graded photo absorption layer using molecular beam epitaxy and ramping a valve position of group-V elements.

* * * * *